(12) United States Patent
Pan et al.

(10) Patent No.: US 12,027,515 B2
(45) Date of Patent: Jul. 2, 2024

(54) CARBON AND/OR OXYGEN DOPED POLYSILICON RESISTOR

(71) Applicant: TEXAS INSTRUMENTS INCORPORATED, Dallas, TX (US)

(72) Inventors: Yanbiao Pan, Plano, TX (US); Robert Martin Higgins, Plano, TX (US); Bhaskar Srinivasan, Allen, TX (US); Pushpa Mahalingam, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 85 days.

(21) Appl. No.: 17/490,950

(22) Filed: Sep. 30, 2021

(65) Prior Publication Data

US 2023/0112644 A1  Apr. 13, 2023

(51) Int. Cl.
*H01L 27/06* (2006.01)
*H01L 21/285* (2006.01)
*H01L 49/02* (2006.01)

(52) U.S. Cl.
CPC .... *H01L 27/0629* (2013.01); *H01L 21/28525* (2013.01); *H01L 21/28556* (2013.01); *H01L 28/20* (2013.01)

(58) Field of Classification Search
CPC .............................. H01L 28/22; H01L 28/20
See application file for complete search history.

(56) References Cited

U.S. PATENT DOCUMENTS

| | | | | |
|---|---|---|---|---|
| 5,064,775 A | * | 11/1991 | Chang | H01L 21/321 438/166 |
| 2010/0193867 A1 | * | 8/2010 | Yan | H01L 29/4958 257/E29.139 |
| 2012/0001267 A1 | * | 1/2012 | Lee | H01L 29/4236 257/E27.06 |
| 2015/0093908 A1 | * | 4/2015 | Reddy | C23C 16/505 438/758 |

* cited by examiner

Primary Examiner — John A Bodnar
(74) Attorney, Agent, or Firm — Andrew R. Ralston; Frank D. Cimino

(57) ABSTRACT

Apparatus, and their methods of manufacture, that include an insulating feature above a substrate and a resistor formed on the insulating feature. Forming the resistor includes depositing polysilicon and doping the polysilicon (e.g., in-situ) with a carbon dopant and/or an oxygen dopant.

20 Claims, 8 Drawing Sheets

CARBON AND/OR OXYGEN DOPED POLYSILICON RESISTOR

TECHNICAL FIELD

The present disclosure relates generally to polysilicon resistors in integrated circuits (ICs) and more particularly, but not exclusively, to polysilicon resistors doped with carbon and/or oxygen and methods for making the same.

BACKGROUND OF THE DISCLOSURE

ICs include transistors and passive components such as resistors fabricated on a single semiconductor substrate. Such resistors may include polysilicon resistors formed simultaneously with gate components of the transistors (e.g., "gate-layer resistors"), as well as other resistors formed at other layers in the IC (e.g., "stand-alone resistors"). However, resistors can limit the functionality of an IC if resistance values are insufficient (e.g., due to size limitations), if resistance values excessively drift (e.g., due to temperature and duration of use), or if resistance matching is inadequate.

SUMMARY OF THE DISCLOSURE

This summary is provided to introduce a selection of concepts that are further described below in the detailed description. This summary is not intended to identify indispensable features of the claimed subject matter, nor is it intended for use as an aid in limiting the scope of the claimed subject matter.

The present disclosure introduces an apparatus, such as an integrated circuit, that includes a resistor located on an insulating feature above a substrate. The resistor is formed of polysilicon comprising a carbon dopant and/or an oxygen dopant.

The present disclosure also introduces a method that includes forming an insulating feature above a substrate, such as of an integrated circuit, and forming a resistor on the insulating feature. Forming the resistor includes depositing polysilicon and doping the deposited polysilicon with a carbon dopant and/or an oxygen dopant.

These and additional aspects of the present disclosure are set forth in the description that follows, and/or may be learned by a person having ordinary skill in the art by reading the material herein and/or practicing the principles described herein. At least some aspects of the present disclosure may be achieved via means recited in the attached claims.

BRIEF DESCRIPTION OF THE DRAWINGS

The present disclosure is understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
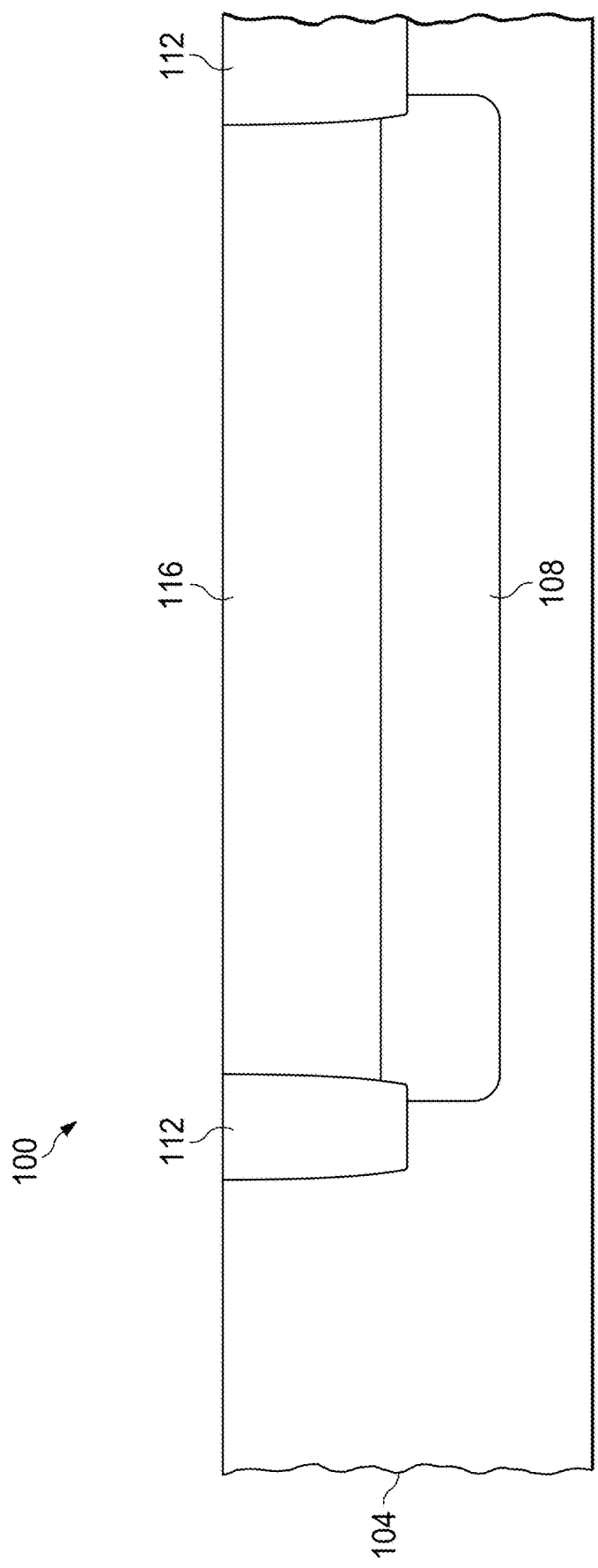
FIG. 1 is a sectional side view of a portion of an example implementation of apparatus in an intermediate stage of manufacturing according to one or more aspects of the present disclosure.

The following disclosure is described with reference to the attached figures. The figures are not drawn to scale, and they are provided merely to illustrate the disclosure. Several aspects of the disclosure are described below with reference to example implementations for illustration. It should be understood that numerous specific details, relationships, and methods are set forth to provide an understanding of the disclosure. However, the following disclosure is not limited by the illustrated ordering of acts or events, some of which may occur in different orders and/or concurrently with other acts or events, yet still fall within the scope of the following disclosure. Moreover, not all illustrated acts or events are required to implement a methodology in accordance with the following disclosure.

In addition, although some of the embodiments illustrated herein are shown in two dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by embodiments directed to example devices, it is not intended that these illustrations be a limitation on the scope or applicability of the present invention. It is not intended that the example devices of the present invention be limited to the physical structures illustrated. These structures are included to demonstrate the utility and application of the present invention to example (and perhaps preferred) implementations.

It is also to be understood that the following disclosure may provide different examples for implementing different features of various implementations. Specific examples of components and arrangements are described below to simplify the present disclosure. These are, of course, merely examples and are not intended to be limiting. In addition, the following disclosure may repeat reference numerals and/or letters in more than one implementation. This repetition is for simplicity and clarity and does not in itself dictate a relationship between the various implementations and/or configurations discussed. Moreover, the formation of a first feature over or on a second feature in the description that follows may include implementations in which the first and second features are formed in direct contact and/or implementations in which additional features may be formed interposing the first and second features, such that the first and second features may not be in direct contact.

FIG. 1 is a sectional side view of a portion of an example implementation of an IC 100 in an intermediate stage of manufacture according to one or more aspects of the present disclosure. In FIG. 1, the IC 100 is being formed in and/or over a semiconductor layer 104 located over a substrate (not shown). The substrate may be silicon, germanium, or gallium arsenide, although the following description refers without limitation to silicon implementations. The semiconductor layer 104 may be a lightly doped semiconductor layer formed on an underlying similar material (e.g., the silicon substrate or wafer) or dissimilar material (e.g., a buried oxide layer or a sapphire wafer). In the context of the present disclosure, "lightly doped" may mean doped to a resistivity of about 1-20 ohm-cm. The semiconductor layer 104 may be grown epitaxially on the underlying material (e.g., a heavily doped p-type wafer), although other processes for forming the semiconductor layer 104 are also within the scope of the present disclosure.

Implementations within the scope of the present disclosure include gate-layer resistors formed from carbon-doped polysilicon, oxygen-doped polysilicon, or carbon-doped and oxygen-doped polysilicon that are formed simultaneously with transistor gate elements of the same material. In some implementations, the doping is performed in-situ while forming the polysilicon features. The following description presents examples of such implementations with respect to FIGS. 1-6. However, as described with respect to FIG. 7, implementations within the scope of the present disclosure may also or instead comprise non-gate-layer resistors formed from carbon-doped and/or oxygen-doped polysilicon that are formed at a different time (or structural layer) relative to the transistor gate elements, in which case the non-gate-layer resistors and the transistor gate elements may or may not be formed of the same material.

The IC 100 may comprise an isolation tank formed of a buried layer 108 and deep wells 112, such that the isolation tank surrounds an enclosed portion 116 of the semiconductor layer 104. For example, in implementations in which the semiconductor layer 104 is a p-type epitaxial layer (among other examples also within the scope of the present disclosure), the buried layer 108 may be an n-type buried layer (NBL) and the deep wells 112 may be n-type deep wells. The processes utilized to form the buried layer 108 and the deep wells 112 may be any conventional or future-developed processes.

Figure 2:
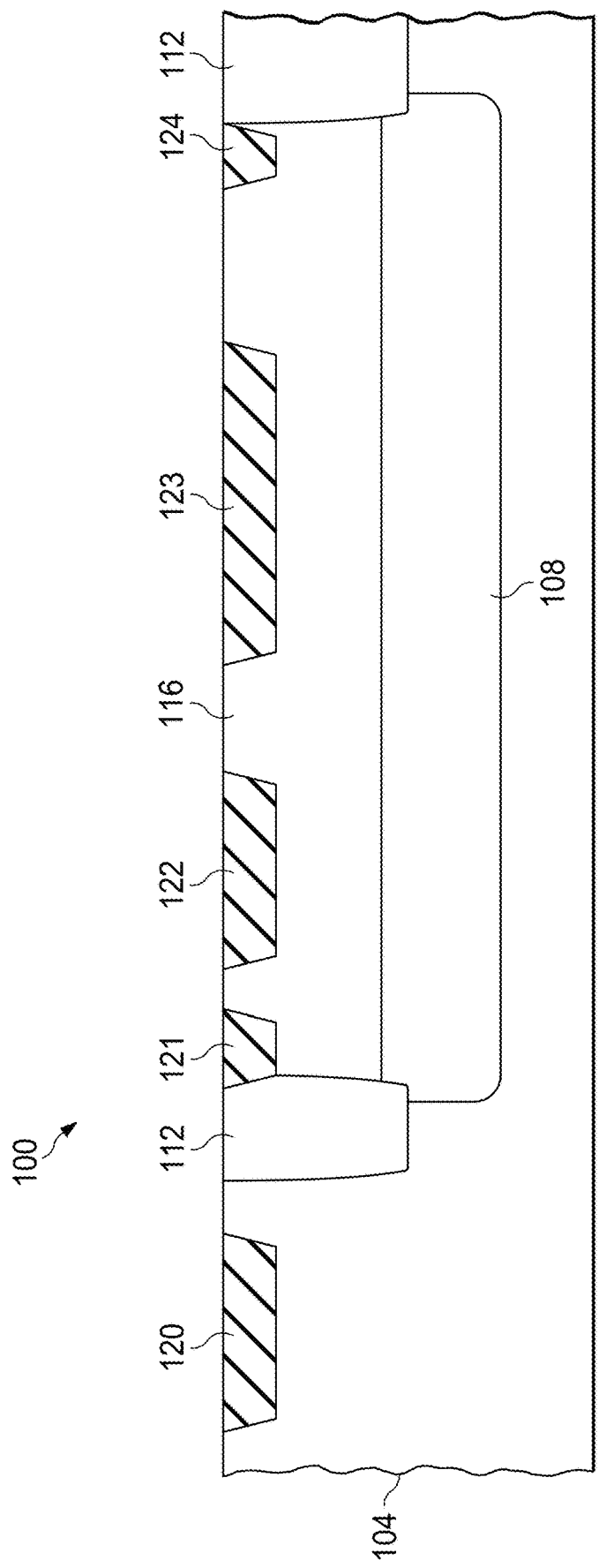
FIG. 2 is a sectional side view of the apparatus shown in FIG. 1 in a subsequent stage of manufacturing according to one or more aspects of the present disclosure.

FIG. 2 is a sectional side view of the example IC 100 shown in FIG. 1 in a subsequent stage of manufacture according to one or more aspects of the present disclosure, in which isolation structures 120-124 have been formed. The isolation structures 120-124 may each comprise shallow trench isolation (STI), a thermal oxide such as that produced in a local oxidation of silicon (LOCOS) process, and/or other electrically insulating materials.

Figure 3:
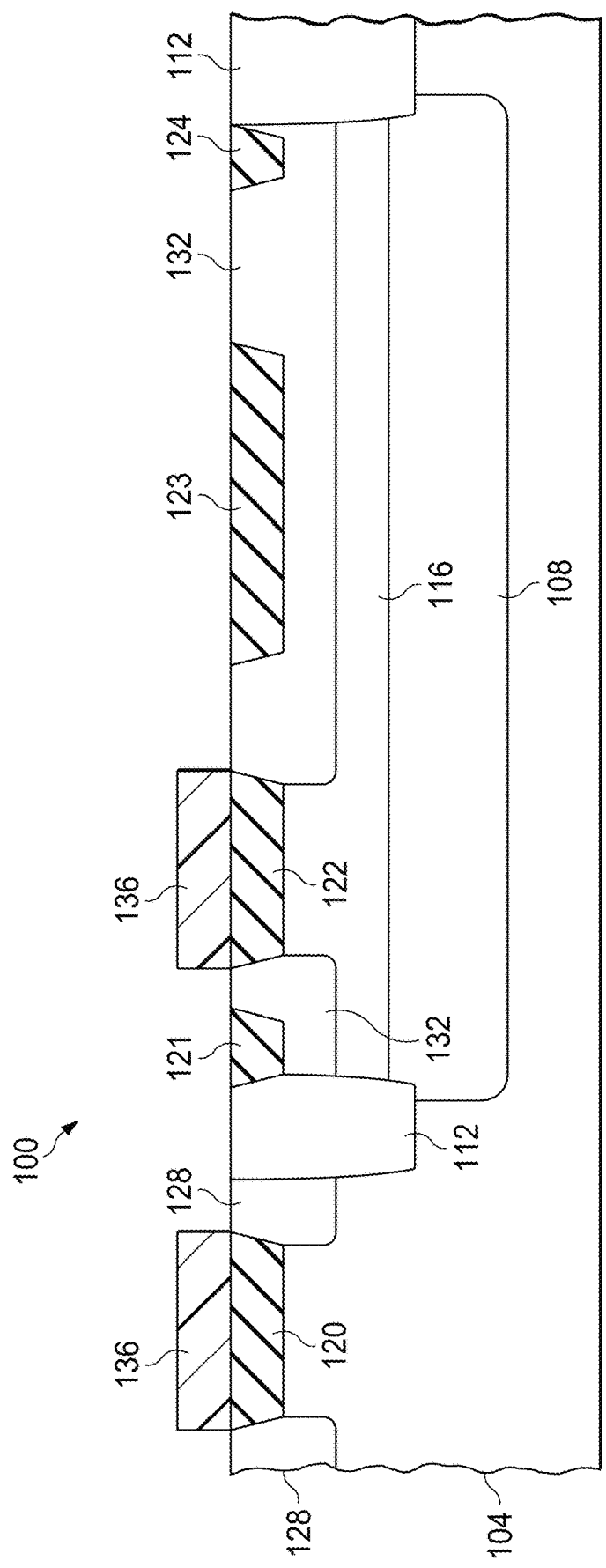
FIG. 3 is a sectional side view of the apparatus shown in FIG. 2 in a subsequent stage of manufacturing according to one or more aspects of the present disclosure.

FIG. 3 is a sectional side view of the example IC 100 shown in FIG. 2 in a subsequent stage of manufacture according to one or more aspects of the present disclosure, in which shallow wells 128, 132 have been implanted utilizing a patterned photomask 136. The shallow wells 128, 132 may have the same conductivity (but with higher dopant concentration) as the semiconductor layer 104. The shallow wells 128, 132 are isolated by the isolation structure(s) 112, such that the buried layer 108 and deep wells 112 collectively enclose the shallow well 132 but not the shallow well 128.

Figure 4:
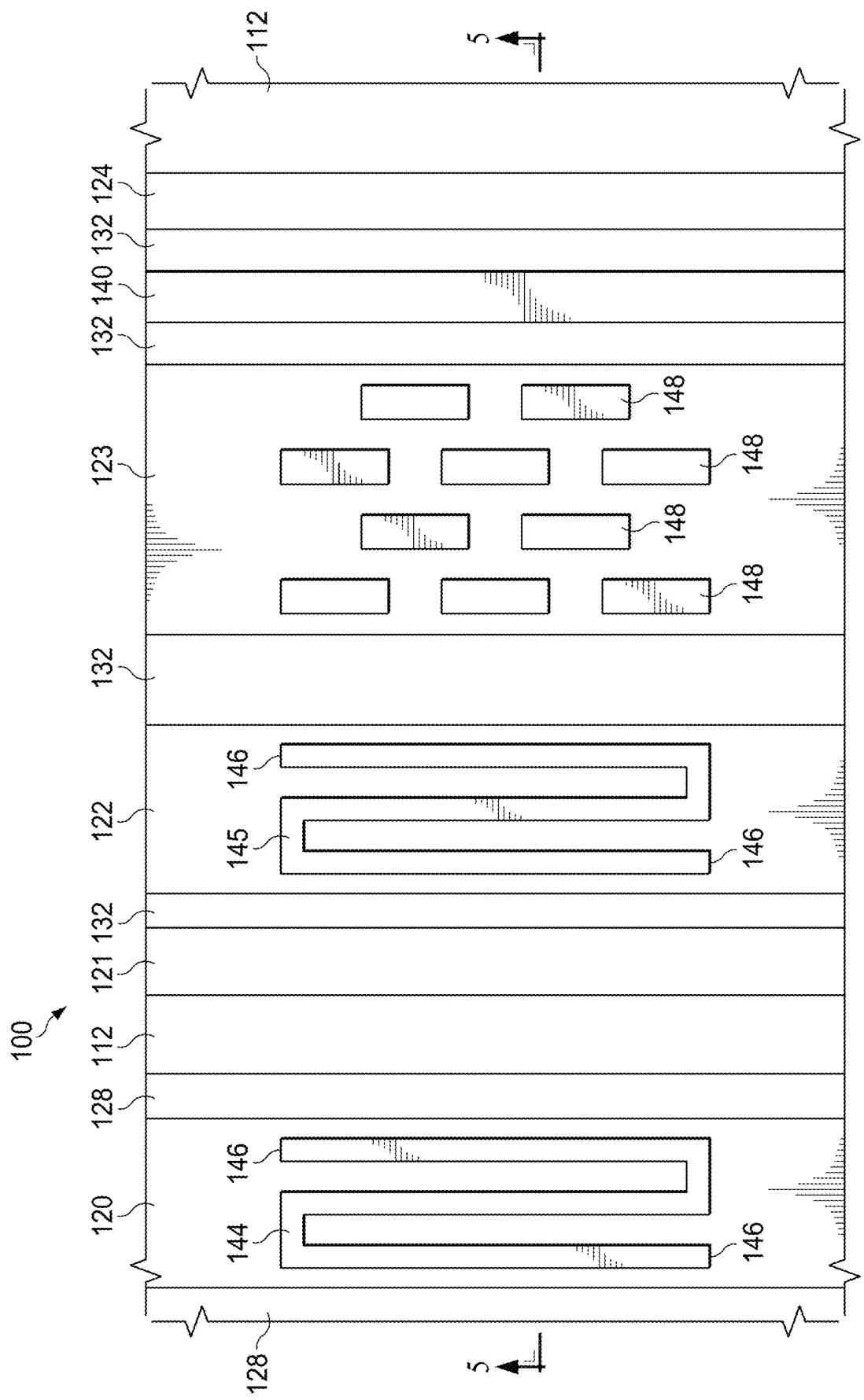
FIG. 4 is a top view of the apparatus shown in FIG. 3 in a subsequent stage of manufacturing according to one or more aspects of the present disclosure.

FIG. 4 is a top view of the example IC 100 shown in FIG. 3 in a subsequent stage of manufacture according to one or more aspects of the present disclosure, in which a transistor gate 140 and two gate-layer resistors 144, 145 have been simultaneously formed. The transistor gate 140 is formed on the shallow well 132 at a location between the isolation structures 123, 124, and the gate-layer resistors 144, 145 are formed on the isolation structures 120, 122, respectively. The IC 100 may also comprise dummy fill structures 148 formed on the isolation structure 123. The dummy fill structures 148 may be automatically placed in the gate-layer design by a pattern-generating program to improve uniformity of an etch process used to form the gate-layer features, or of a planarization process that follows deposition of a dielectric layer over the gate-layer structures. The dummy fill structures 148 are not electrically connected to any circuit, and thus are electrically isolated. A patterned oxide or other dielectric layer 152 (see FIG. 5) may be formed prior to forming the transistor gate 140, the gate-layer resistors 144, 145, and the dummy fill structures 148, so as to interpose such features 140, 144, 145, 148 and their respective underlying features 132, 120, 122, 123.

The transistor gate 140, the gate-layer resistors 144, 145, and the dummy fill structures 148 are formed of polysilicon comprising a carbon and/or oxygen dopant. For example, the polysilicon may be doped with carbon at a concentration of 2.0 mole percent (mol %) or otherwise within a range of 1.5-2.5 mol %. The polysilicon may also or instead be doped with oxygen at a concentration of 2.0 mol % or otherwise within a range of 1.5-2.5 mol %, or oxygen at a concentration of 5.0 mol % or otherwise within a range of 4.5-5.5 mol %. In addition to the carbon and/or oxygen dopant, the polysilicon may also be doped with an n-type or p-type dopant, such as boron, arsenic, and/or phosphorus.

The polysilicon may be doped with the carbon and/or oxygen in-situ during deposition of the polysilicon via chemical vapor deposition (CVD). For example, the CVD may utilize silane ($SiH_4$) at a flow rate of 500 standard cubic centimeters per minute (sccm), or otherwise within a range of 200-800 sccm, to form the polysilicon. The CVD may additionally utilize nitrogen ($N_2$) at a flow rate of 500 sccm or otherwise within a range of 250-750 sccm. If the polysilicon is to be in-situ doped with carbon, the CVD may additionally utilize ethylene ($C_2H_4$) at a flow rate of 40 sccm or otherwise within a range of 25-75 sccm. If the polysilicon is to be doped with oxygen, the CVD may additionally utilize nitrous oxide ($N_2O$) at a flow rate of 80 sccm or otherwise within a range of 40-120 sccm. The CVD may be performed at a temperature of 600-630 degrees Celsius and a pressure of 150-400 mTorr and/or other parameters that may deposit the in-situ doped polysilicon at a rate of 40-100 Angstroms/minute and/or other rates.

The polysilicon may instead (or additionally) be implanted with carbon and/or oxygen. For example, carbon and/or oxygen may be implanted in the deposited polysilicon via one or more implant processes, such as a chain implant to distribute the carbon and/or oxygen within the deposited polysilicon more uniformly relative to an oxygen distribution resulting from conventional silicon-over-insulator (SOI) processes. One or more anneal processes may also be utilized to drive and distribute the carbon and/or oxygen into the deposited polysilicon. A person having ordinary skill in the art can readily determine implant dose and energy levels that result in the described doped polysilicon features introduced herein, as well as use of photoresist to mask off any portions of the circuit that require protection from the carbon and/or oxygen implant(s). Such photoresist may provide an advantage where, for example, it is undesirable to dope certain portions of the deposited polysilicon.

The doped polysilicon may have a thickness of 100 nanometers (nm) to 180 nm. Achieving such thickness may be accomplished by several processes. For example, the doped polysilicon may be deposited to form a continuous layer across the substrate, a chemical-mechanical planarization (CMP) process may then polish the doped polysilicon down to the intended thickness, and a subsequently formed and patterned photoresist may be utilized as an etch mask for an anisotropic plasma etch of the doped polysilicon to form the transistor gate 140, the gate-layer resistors 144, 145, and the dummy fill structures 148. However, other processes for forming the doped polysilicon are also within the scope of the present disclosure.

Figure 5:
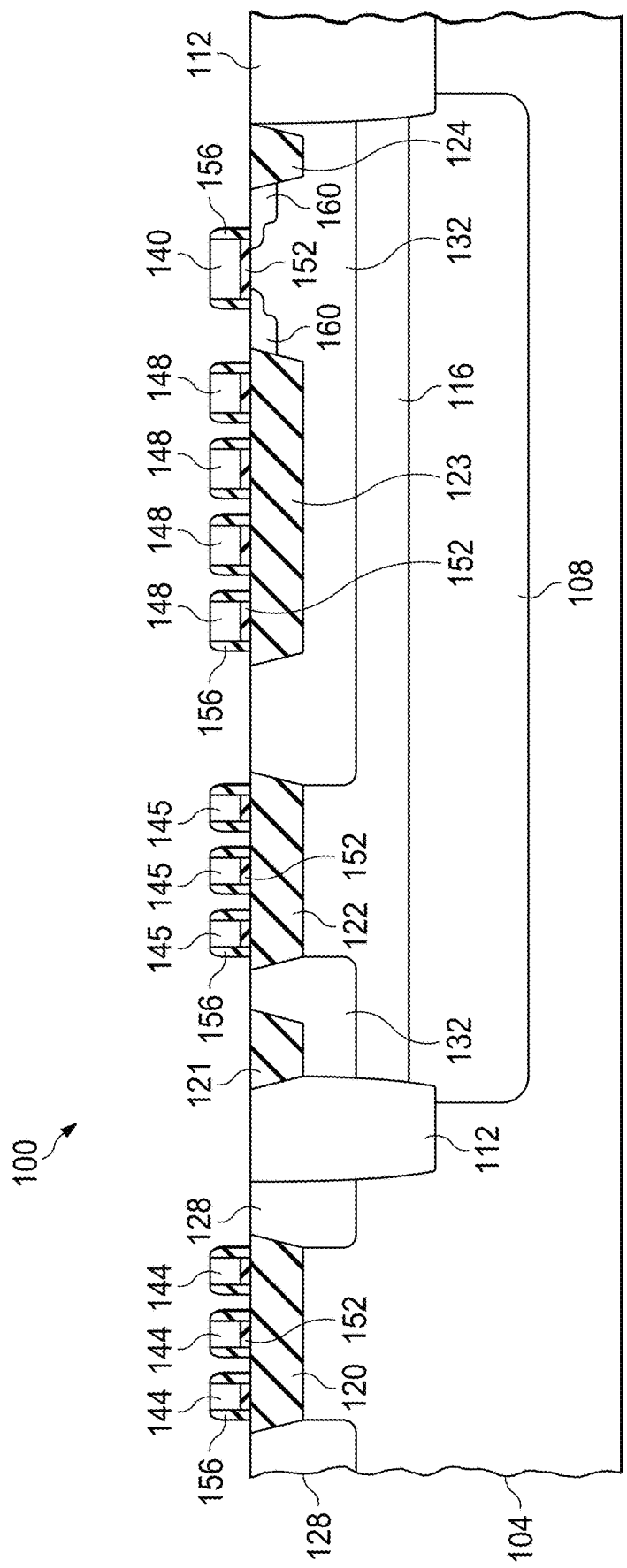
FIG. 5 is a sectional side view of the apparatus shown in FIG. 4 in a subsequent stage of manufacturing according to one or more aspects of the present disclosure.

FIG. 5 is a sectional side view of the example IC 100 shown in FIG. 4 in a subsequent stage of manufacture according to one or more aspects of the present disclosure, in which sidewall spacers 156 have been formed along the vertical sides of the transistor gate 140, the gate-layer resistors 144, 145, and the dummy fill structures 148. FIG. 5 also depicts the formation of source/drain (S/D) regions 160 formed on opposing sides of the transistor gate 140. Any conventional or future-developed processes may be utilized to form the spacers 156 and the S/D regions 160. While the transistor formed of the shallow well 132, the gate 140, the gate dielectric 152, the spacers 156, and the S/D regions 160 is depicted in FIG. 5 as a metal-oxide-semiconductor (MOS) transistor, the transistor may be of any other type, e.g., bipolar, power, laterally diffused MOS (LDMOS), etc. In various implementations, the IC 100 may comprise combinations of different types of transistors, such as both MOS and bipolar transistors.

Figure 6:
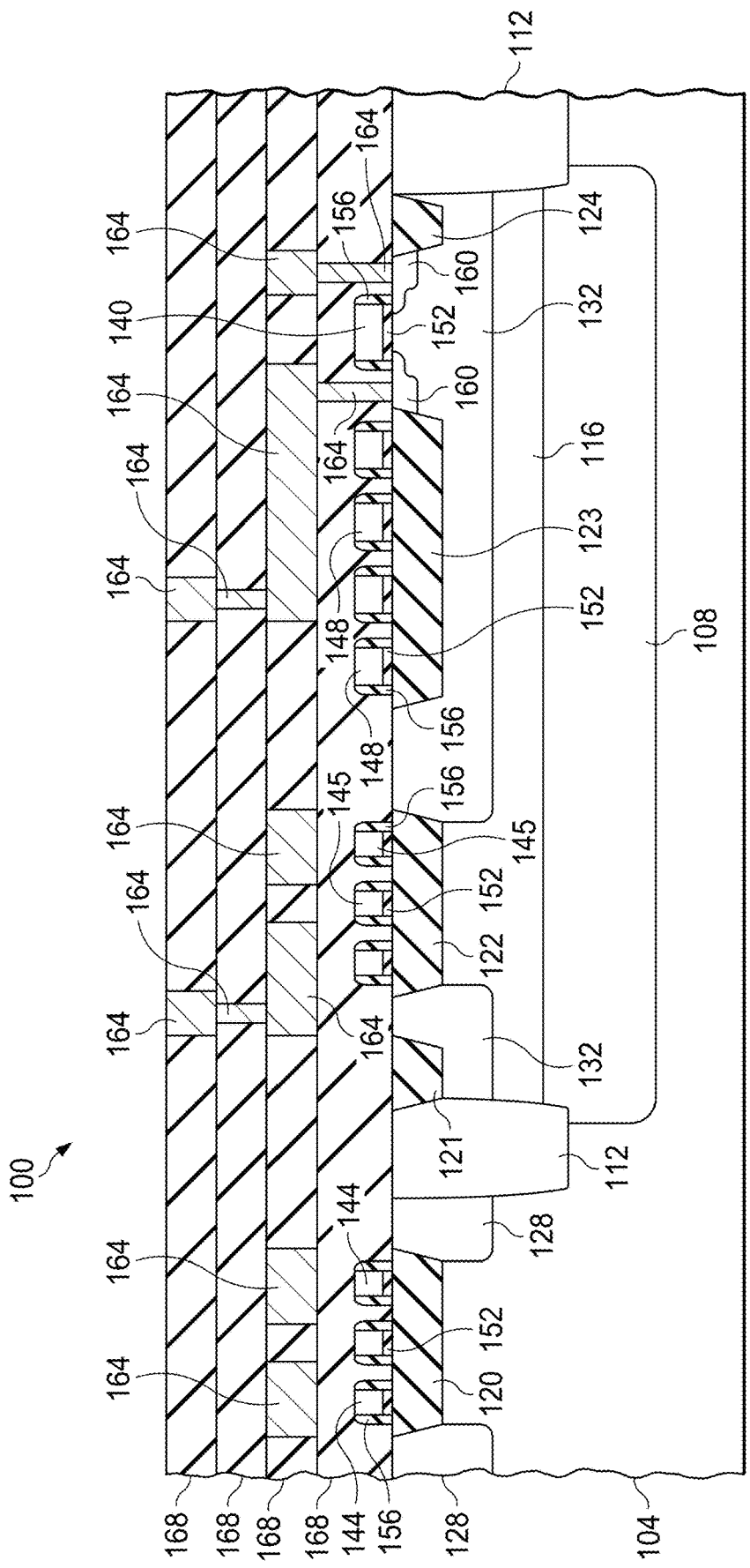
FIG. 6 is a sectional side view of the apparatus shown in FIG. 5 in a subsequent stage of manufacturing according to one or more aspects of the present disclosure.

FIG. 6 is a sectional side view of the example IC 100 shown in FIG. 5 in a subsequent stage of manufacture according to one or more aspects of the present disclosure, in which an interconnect structure has been formed from traces, vias, and/or other conductors 164 separated by intermetallic dielectric layers 168. The interconnect structure includes conductors 164 landing on the S/D regions 160 for operation of the transistor, as well as conductors (not shown) in contact with ends 146 of the gate-layer resistors 144, 145.

Figure 7:
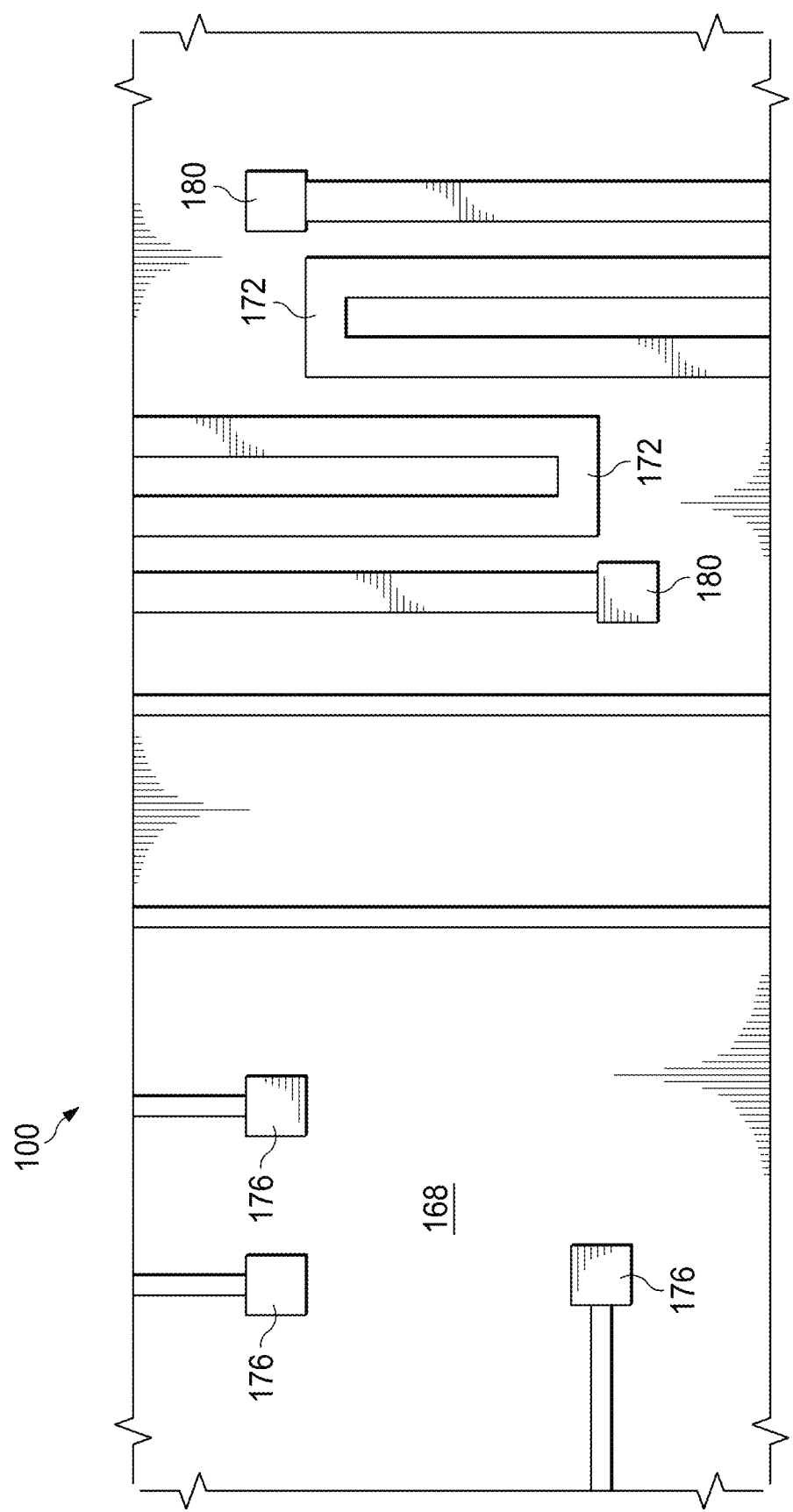
FIG. 7 is a top view of the apparatus shown in FIG. 6 in a subsequent stage of manufacturing according to one or more aspects of the present disclosure.

FIG. 7 is a top view of the example IC 100 shown in FIG. 6 in a subsequent stage of manufacture according to one or more aspects of the present disclosure, in which non-gate-layer resistors 172 have been formed in or over one of the intermetallic dielectric layers 168. The non-gate-layer resistors 172 are formed of polysilicon that is doped in-situ with carbon and/or oxygen, such as in-situ doping as described above with respect to the gate-layer resistors 144, 145. The layer 168 shown in FIG. 7 also includes metallic contacts 176 connected with the vias, traces, and/or other conductors 164 of underlying layers, such as those depicted in FIG. 6. The non-gate-layer resistors 172 are also connected with metallic contacts 180 that may be connected with conductors 164 of the underlying layers.

FIG. 7 demonstrates that a single IC may comprise either gate-layer resistors, non-gate-layer resistors, or both. The gate-layer resistors are coplanar with the gates of the transistors of the IC and, because they are formed simultaneously by the same deposition process, the gate-layer resistors and the transistor gates both comprise the in-situ carbon and/or oxygen dopant. The non-gate-layer resistors are not coplanar with the transistor gates, and the transistor gates may or may not comprise the carbon and/or oxygen dopant of the non-gate-layer resistors, or may contain carbon and/or oxygen dopant at a different concentration than in the gate-layer resistors.

Figure 8:
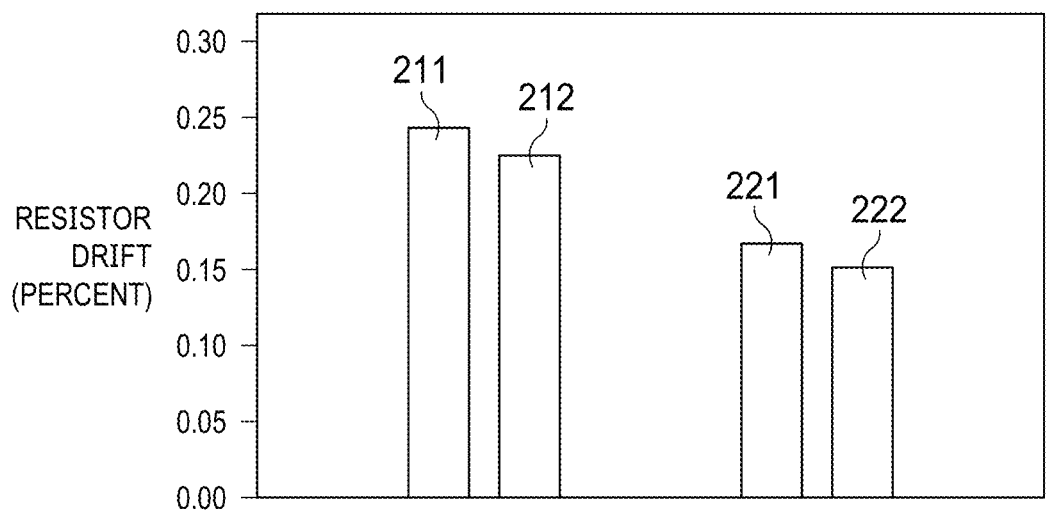
FIG. 8 is a graph depicting example experimental results according to one or more aspects of the present disclosure.

Performing in-situ carbon and/or oxygen doping while depositing polysilicon to form the gate-layer resistors or the non-gate-layer resistors can reduce resistor drift. For example, FIG. 8 is a graph depicting experimental results for resistor drift, including an example resistor drift 211 for a conventional high sheet resistance polysilicon resistor, as well as an example reduced resistor shift 212 for an otherwise same high sheet resistance polysilicon resistor including 2% in-situ carbon dopant. The graph also depicts an example resistor drift 221 for a conventional very high sheet resistance polysilicon resistor, as well as an example reduced resistor shift 222 for an otherwise same very high sheet resistance polysilicon resistor including 2% in-situ carbon dopant. In both examples, the 2% in-situ carbon dopant reduced resistor shift by about 30%.

Figure 9:
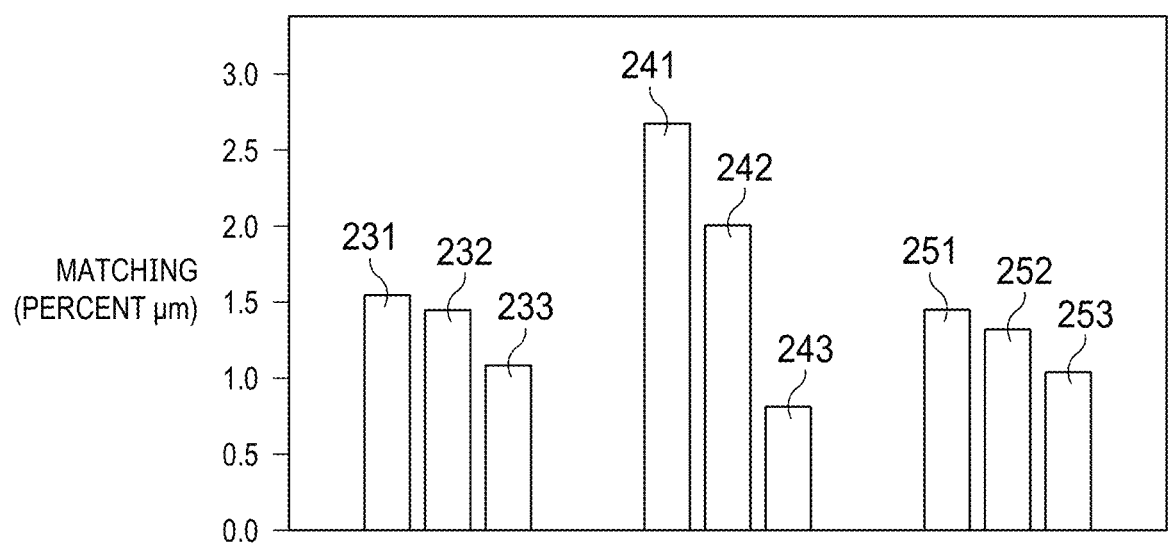
FIG. 9 is a graph depicting further example experimental results according to one or more aspects of the present disclosure.

Carbon and/or oxygen doping of polysilicon to form the gate-layer resistors or the non-gate-layer resistors can also improve resistance matching. For example, FIG. 9 is a graph depicting experimental results for resistance matching, including an example resistance matching 231 for a conventional p-type source/drain (PSD) doped polysilicon resistor without carbon or oxygen dopant, an example resistance matching 232 for the same PSD doped polysilicon resistor with 2% in-situ oxygen dopant, and an example resistance matching 233 for the same resistor with 5% in-situ oxygen dopant. The graph also depicts an example resistance matching 241 for a conventional n-type source/drain (NSD) doped polysilicon resistor without carbon or oxygen dopant, an example resistance matching 242 for the same resistor with 2% in-situ oxygen dopant, and an example resistance matching 243 for the same resistor with 5% in-situ oxygen dopant. The graph also depicts an example resistance matching 251 for a conventional p-type source drain with n-type lightly doped drain (PSD-NLDD) doped polysilicon resistor without carbon or oxygen dopant, an example resistance matching 252 for the same resistor with 2% in-situ oxygen dopant, and an example resistance matching 253 for the same resistor with 5% in-situ oxygen dopant. In each example, the increasing concentration of in-situ oxygen dopant increased resistance matching.

While oxygen implanting in silicon is known for SOI techniques, the experimental results described above demonstrate that implanting and/or in-situ doping of polysilicon with carbon and/or oxygen according to one or more aspects introduced in the present disclosure can be advantageous. Moreover, the experimental results are unexpected, in that the carbon and/or oxygen implant and/or in-situ doping unexpectedly reduce drift and/or improve matching, potentially by an unexpectedly large magnitude of the reduced drift and/or the improved matching.

The carbon and/or oxygen implant and/or in-situ doping of the present disclosure can also result in a doped polysilicon resistor having a uniform distribution of carbon and/or oxygen. In contrast, the oxygen implant utilized for SOI results in a non-uniform distribution of oxide in the implanted silicon. For example, particularly in implementations utilizing the in-situ doping of carbon and/or oxygen, the concentration of carbon and/or oxygen may vary by less than 10%, 5%, or less, in any direction within the polysilicon resistor, such that the carbon and/or oxygen concentration may have a three-dimensionally uniform distribution throughout the polysilicon.

In view of the entirety of the present disclosure, a person having ordinary skill in the art will readily recognize that the present disclosure introduces an apparatus such as an integrated circuit comprising a resistor located on an insulating feature above a substrate, wherein the resistor is formed of polysilicon comprising a dopant, and wherein the dopant is one of oxygen and carbon.

The dopant may be oxygen at a concentration of 1.5-2.5 mol % or 4.5-5.5 mol %.

The dopant may be carbon at a concentration of 1.5-2.5 mol %.

The dopant may be oxygen and the polysilicon may further comprise a carbon dopant.

The apparatus may comprise a transistor having a gate located above the substrate, the resistor and the gate may be coplanar, and the resistor and the gate may both comprise the dopant.

The apparatus may comprise a transistor having a gate located above the substrate, the resistor and the gate may not be coplanar, and the gate may not comprise the dopant.

The apparatus may comprise: a transistor having a gate located above the substrate, wherein the resistor and the gate may be coplanar; and an additional resistor formed of polysilicon comprising an additional dopant, wherein the additional dopant may be one of oxygen and carbon, and wherein the first and second resistors may not be coplanar.

The polysilicon may also be doped with an n-type or p-type dopant, such as at least one of boron, arsenic, and phosphorus.

The present disclosure also introduces a method comprising: forming an insulating feature above a substrate; and forming a resistor on the insulating feature, including depositing polysilicon and doping the deposited polysilicon with a dopant, wherein the dopant is one of oxygen and carbon.

The doping may be provided by in-situ doping during formation of the polysilicon.

The dopant may be oxygen and may result in an oxygen concentration of 1.5-2.5 mol % or 4.5-5.5 mol %.

The dopant may be carbon and may result in a carbon concentration of 1.5-2.5 mol %.

The dopant may be oxygen and depositing the polysilicon may further comprise doping the deposited polysilicon in-situ with a carbon dopant.

Forming the resistor may further comprise, after depositing the in-situ doped polysilicon, further doping the in-situ doped polysilicon with an n-type or p-type dopant, such as boron, arsenic, and phosphorus.

The dopant may be carbon and depositing the doped polysilicon may be performed via CVD utilizing $SiH_4$ at a flow rate of 200-800 sccm with in-situ doping with carbon provided by $C_2H_4$ at a flow rate of 25-75 sccm. Such CVD may further utilize $N_2$ at a flow rate of 250-750 sccm.

The dopant may be oxygen and the doped polysilicon may be deposited via CVD utilizing $SiH_4$ at a flow rate of 200-800 sccm with in-situ doping with oxygen provided by $N_2O$ at a flow rate of 40-120 sccm. Such CVD may further utilize $N_2$ at a flow rate of 250-750 sccm.

The method may further comprise forming a transistor gate via the in-situ doped polysilicon deposition simultaneous with forming the resistor.

The foregoing outlines features of several embodiments so that a person having ordinary skill in the art may better understand the aspects of the present disclosure. A person having ordinary skill in the art will appreciate that they may readily use the present disclosure as a basis for designing or modifying other processes and structures for carrying out the same functions and/or achieving the same benefits of the embodiments introduced herein. A person having ordinary skill in the art will also realize that such equivalent constructions do not depart from the scope of the present disclosure, and that they may make various changes, substitutions and alterations herein without departing from the scope of the present disclosure.

The Abstract at the end of this disclosure is provided to comply with 37 C.F.R. § 1.72(b) to permit the reader to quickly ascertain the nature of the technical disclosure. It is submitted with the understanding that it will not be used to interpret or limit the scope or meaning of the claims.

What is claimed is:

1. A method of forming an integrated circuit, comprising:
   forming an insulating feature above a substrate; and
   forming a resistor on the insulating feature, including:
   depositing a polysilicon layer;
   doping the polysilicon layer with one of oxygen and carbon; and
   doping the polysilicon layer with an n-type dopant or a p-type dopant.

2. The method of claim 1 wherein doping the polysilicon layer with oxygen results in an oxygen concentration of 1.5-2.5 mole percent (mol %).

3. The method of claim 2 wherein the doping with one of oxygen and carbon is performed in-situ while depositing the polysilicon layer.

4. The method of claim 1 wherein the doping the polysilicon layer results in an oxygen concentration of 4.5-5.5 mole percent (mol %).

5. The method of claim 1 wherein the doping the polysilicon layer results in a carbon concentration of 1.5-2.5 mole percent (mol %).

6. The method of claim 1 wherein the doping includes oxygen, and wherein depositing the polysilicon layer further comprises doping the deposited polysilicon layer in-situ with a carbon dopant.

7. The method of claim 1 wherein doping the polysilicon layer with the n-type dopant or the p-type dopant is performed after doping the polysilicon layer with one of oxygen and carbon.

8. The method of claim 1 wherein the polysilicon layer is deposited and in-situ doped via chemical vapor deposition (CVD) utilizing:
   $SiH_4$ at a flow rate of 200-800 standard cubic centimeters per minute (sccm); and
   $C_2H_4$ at a flow rate of 25-75 sccm.

9. The method of claim 1 wherein the polysilicon layer is deposited and in-situ doped via chemical vapor deposition (CVD) utilizing:
   $SiH_4$ at a flow rate of 200-800 standard cubic centimeters per minute (sccm); and
   $N_2O$ at a flow rate of 40-120 sccm.

10. The method of claim 9 wherein the CVD further utilizes $N_2$ at a flow rate of 250-750 sccm.

11. The method of claim 1 further comprising forming a transistor gate from the polysilicon layer simultaneous with forming the resistor.

12. A method of forming an integrated circuit, comprising:
   forming a dielectric layer over a semiconductor substrate;
   forming a polysilicon body over the dielectric layer;
   doping the polysilicon body with oxygen or carbon; and
   doping the polysilicon body with an n-type or p-type dopant.

13. The method of claim 12, wherein doping the polysilicon body with an n-type dopant or a p-type dopant includes performing a source/drain implant.

14. The method of claim 12, wherein doping the polysilicon body with an n-type dopant or a p-type dopant includes performing a lightly-doped drain (LDD) implant.

15. The method of claim 12, wherein doping the polysilicon body with an n-type dopant or a p-type dopant is performed after the doping with oxygen or carbon.

16. The method of claim 12 wherein the polysilicon body is doped with carbon or oxygen in-situ during polysilicon deposition.

17. The method of claim 12 further comprising forming a transistor gate simultaneous with forming the polysilicon body.

18. A method of forming an integrated circuit, comprising:
   forming a dielectric layer over a semiconductor substrate;
   forming a polysilicon resistor body over the dielectric layer;
   doping the polysilicon resistor body with oxygen or carbon; and
   doping the polysilicon resistor body with an n-type or p-type dopant by a source/drain implant process.

19. The method of claim 18 wherein the resistor body is doped with carbon or oxygen in-situ during polysilicon deposition.

20. The method of claim 18 wherein a transistor gate is doped with oxygen or carbon simultaneous with doping the resistor body with oxygen or carbon.

\* \* \* \* \*